United States Patent
Yu et al.

(10) Patent No.: US 9,705,023 B2
(45) Date of Patent: Jul. 11, 2017

(54) AVALANCHE PHOTODIODE AND MANUFACTURING METHOD THEREOF

(71) Applicant: Huawei Technologies Co., Ltd., Shenzhen (CN)

(72) Inventors: Changliang Yu, Wuhan (CN); Zhenxing Liao, Wuhan (CN); Yanli Zhao, Wuhan (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/234,256

(22) Filed: Aug. 11, 2016

(65) Prior Publication Data

US 2016/0351743 A1  Dec. 1, 2016

Related U.S. Application Data

(63) Continuation of application No. PCT/CN2014/071987, filed on Feb. 12, 2014.

(51) Int. Cl.
*H01L 31/107* (2006.01)
*H01L 31/18* (2006.01)
(Continued)

(52) U.S. Cl.
CPC ........ *H01L 31/1075* (2013.01); *G02B 6/1228* (2013.01); *G02B 6/131* (2013.01);
(Continued)

(58) Field of Classification Search
CPC ............. H01L 31/1075; H01L 31/1804; H01L 31/02327; H01L 31/022408; H01L 31/028;
(Continued)

(56) References Cited

U.S. PATENT DOCUMENTS 7,082,248 B1   7/2006 Morse
7,397,101 B1   7/2008 Masini et al.
(Continued)

FOREIGN PATENT DOCUMENTS

CN   101490856 A   7/2009
CN   102916071 A   2/2013
(Continued)

OTHER PUBLICATIONS

Duan, N., et al., "310 GHz gain-bandwidth product Ge/Si avalanche photodetector for 1550 nm light detection," Optics Express, vol. 20, No. 10, May 7, 2012, 6 pages.
(Continued)

*Primary Examiner* — Jarrett Stark
(74) *Attorney, Agent, or Firm* — Conley Rose, P.C.

(57) ABSTRACT

An avalanche photodiode includes a GeOI substrate; an I—Ge absorption layer configured to absorb an optical signal and generate a photo-generated carrier; a first p-type SiGe layer, a second p-type SiGe layer, a first SiGe layer, and a second SiGe layer, where a Si content in any one of the SiGe layers is less than or equal to 20%; a first $SiO_2$ oxidation layer and a second $SiO_2$ oxidation layer; a first taper type silicon Si waveguide layer and a second taper type silicon Si waveguide layer; a heavily-doped n-type silicon Si multiplication layer; and anode electrodes and a cathode electrode.

20 Claims, 3 Drawing Sheets

(51) Int. Cl.

| | | |
|---|---|---|
| *G02B 6/122* | (2006.01) | |
| *G02B 6/13* | (2006.01) | |
| *H01L 31/0224* | (2006.01) | |
| *H01L 31/0232* | (2014.01) | |
| *H01L 31/028* | (2006.01) | |
| *G02B 6/12* | (2006.01) | |

(52) U.S. Cl.
CPC ...... *H01L 31/028* (2013.01); *H01L 31/02327* (2013.01); *H01L 31/022408* (2013.01); *H01L 31/107* (2013.01); *H01L 31/18* (2013.01); *H01L 31/1804* (2013.01); *G02B 2006/12061* (2013.01)

(58) Field of Classification Search
CPC ..... H01L 31/107; H01L 31/18; G02B 6/1228; G02B 6/131; G02B 2006/12061
See application file for complete search history.

(56) References Cited

U.S. PATENT DOCUMENTS

| | | | |
|---|---|---|---|
| 2005/0167709 A1* | 8/2005 | Augusto | ........... H01L 27/14643 257/292 |
| 2007/0134901 A1 | 6/2007 | Chang et al. | |
| 2008/0012104 A1 | 1/2008 | Pauchard et al. | |
| 2009/0173976 A1* | 7/2009 | Augusto | ........... H01L 27/14669 257/292 |
| 2012/0126286 A1* | 5/2012 | Na | ........................ H01L 31/105 257/186 |
| 2013/0292741 A1 | 11/2013 | Huang et al. | |

FOREIGN PATENT DOCUMENTS

| | | |
|---|---|---|
| CN | 103262264 A | 8/2013 |
| JP | 2001127336 A | 5/2001 |
| WO | 2011083657 A1 | 7/2011 |
| WO | 2013101110 A1 | 7/2013 |

OTHER PUBLICATIONS

Kang, Y., et al., "Epitaxially-grown Ge/Si avalanche photodiodes for 1.3μm light detection," Optics Express, vol. 16, No. 13, Jun. 23, 2008, 7 pages.

Zhu, S., et al., "Waveguided Ge/Si Avalanche Photodiode With Separate Vertical SEG-Ge Absorption, Lateral Si Charge, and Multiplication Configuration," IEEE Electron Device Letters, vol. 30, No. 9, Sep. 2009, pp. 934-936.

Foreign Communication From a Counterpart Application, Chinese Application No. 201480000097.4, Chinese Issue Notification dated Dec. 27, 2016, 1 page.

Foreign Communication From a Counterpart Application, Chinese Application No. 201480000097.4, Chinese Notice of Allowance dated Dec. 27, 2016, 1 page.

Foreign Communication From a Counterpart Application, Chinese Application No. 201480000097.4, Chinese Search Report dated May 23, 2016, 2 page.

Foreign Communication From a Counterpart Application, Chinese Application No. 201480000097.4, Chinese Office Action dated Jul. 6, 2016, 3 page.

Foreign Communication From a Counterpart Application, PCT Application No. PCT/CN2014/071987, English Translation of International Search Report dated Jul. 3, 2014, 2 pages.

Foreign Communication From a Counterpart Application, PCT Application No. PCT/CN2014/071987, English Translation of Written Opinion dated Jul. 3, 2014, 7 pages.

Machine Translation and Abstract of Chinese Publication No. CN102916071, Feb. 6, 2013, 25 pages.

Huang, Z., et al., "Effectiveness of SiGe Buffer Layers in Reducing Dark Currents of Ge-on-Si Photodetectors," IEEE Journal of Quantum Electronics, vol. 43, No. 3, Mar. 1, 2007, pp. 238-242.

Ahn, D., et al., "Evanescent Coupling Device Design for Waveguide-Integrated Group IV Photodetectors," Journal of Lightwave Technology, vol. 28, No. 23, Dec. 1, 2010, pp. 3387-3394.

Morrison, A., et al., "Progress towards photon counting between 1μm and 1.6μm using silicon with infra-red absorbers," Proceedings of the SPIE, vol. 7681, Apr. 21, 2010, 15 pages.

Liu, J., et al., "Monolithically Integrated Ge-on-Si Active Photonics," Photonics, ISSN 2304-6732, May 27, 2014, pp. 162-197.

Foreign Communication From A Counterpart Application, European Application No. 14882321.4, Extended European Search Report dated Mar. 24, 2017, 13 pages.

* cited by examiner

AVALANCHE PHOTODIODE AND MANUFACTURING METHOD THEREOF

CROSS-REFERENCE TO RELATED APPLICATIONS

This application is a continuation application of international application number PCT/CN2014/071987 filed on Feb. 12, 2014, which is incorporated by reference.

TECHNICAL FIELD

The present disclosure relates to the field of communications, and in particular, to an avalanche photodiode and a manufacturing method thereof.

BACKGROUND

With increasing commercialization of 10G-PONs and increasing maturity of a next-generation PON technology, a high-speed optical module raises increasingly urgent requirements for a high responsivity (which may also be referred to as high flexibility), high-bandwidth photodetector. Although a high-speed PIN detector may have a very high speed and relatively low costs, responsivity of the high-speed PIN detector is also relatively low; therefore, it is difficult to meet a requirement of a high-speed PON network for flexibility and a power budget. An APD may have very high responsivity due to a multiplication effect, and therefore becomes a preferred high-speed optical module.

Currently, a 10 Gb/s APD is costly, and the APD has a relatively strong dark current, limiting flexibility of the APD.

SUMMARY

Embodiments of the present disclosure provide an avalanche photodiode and a manufacturing method thereof, which can resolve problems in some approaches that an APD has a relatively strong dark current and is costly.

To achieve the foregoing objective, the following technical solutions are used in the embodiments of the present disclosure.

According to a first aspect, an avalanche photodiode is provided, including: a GeOI substrate, where: an I—Ge absorption layer is disposed on the GeOI substrate and is configured to absorb an optical signal and generate a photogenerated carrier; a second positive p-type SiGe layer is disposed on the I—Ge absorption layer, and a first p-type SiGe layer is disposed on the second p-type SiGe layer, where a Ge content in either the first p-type SiGe layer or the second p-type SiGe layer is less than or equal to 20%; a first $SiO_2$ oxidation layer is further disposed on the GeOI substrate, and a second $SiO_2$ oxidation layer is disposed on the first $SiO_2$ oxidation layer; a first SiGe layer and a second SiGe layer are disposed on the first $SiO_2$ oxidation layer, where a Ge content in either of the SiGe layers is less than or equal to 20%; a first taper type Si waveguide layer and a second taper type Si waveguide layer are further respectively disposed on the second $SiO_2$ oxidation layer and the first SiGe layer; a heavily-doped negative n-type Si multiplication layer is disposed on the second SiGe layer and the first p-type SiGe layer; a cathode electrode is disposed on the heavily-doped n-type Si multiplication layer; and anode electrodes are disposed on the GeOI substrate; where the first taper type Si waveguide layer, the second taper type silicon waveguide layer, the first SiGe layer, and the second SiGe layer form an evanescent wave coupling structure; the first SiGe layer, the second SiGe layer, the first p-type SiGe layer, and the second p-type SiGe layer form a taper type structure; and the first SiGe layer, the second SiGe layer, the first p-type SiGe layer, the second p-type SiGe layer, and the I—Ge absorption layer form an evanescent wave coupling structure.

In a first possible implementation manner of the first aspect, the sum of a thickness of the first SiGe layer and a thickness of the second SiGe layer is different from the sum of a thickness of the first p-type SiGe layer and a thickness of the second p-type SiGe layer.

In a second possible implementation manner of the first aspect, a width range of the first SiGe layer is 1.4 µm to 30 µm, a length range of the first SiGe layer is 10 µm to 500 µm, and a thickness range of the first SiGe layer is 0.02 µm to 2.7 µm.

In a third possible implementation manner of the first aspect, a width range of the second SiGe layer progressively decreases from 1.4 µm to 30 µm to 1 µm to 20 µm, a length range of the second SiGe layer is 1 µm to 20 µm, and a thickness range of the second SiGe layer is 0.02 µm to 2.7 µm.

In a fourth possible implementation manner of the first aspect, a width range of the first p-type SiGe layer is 1 µm to 20 µm, a length range of the first p-type SiGe layer is 4 µm to 230 µm, and a thickness range of the first p-type SiGe layer is 0.02 µm to 2.7 µm.

In a fifth possible implementation manner of the first aspect, a width range of the second p-type SiGe layer is 1.1 µm to 22 µm, a length range of the second p-type SiGe layer is 4 µm to 230 µm, and a thickness range of the second p-type SiGe layer is 0.005 µm to 1 µm.

According to a second aspect, an avalanche photodiode manufacturing method is provided, including epitaxially growing an I—Ge absorption layer on a GeOI substrate; growing a second positive p-type SiGe layer on the I—Ge absorption layer; growing a second $SiO_2$ oxidation layer on the GeOI substrate; growing, on the second $SiO_2$ oxidation layer, a taper waveguide including a first SiGe layer and a second SiGe layer; growing a first p-type SiGe layer on the second p-type SiGe layer; performing p-type ion injection on the first p-type SiGe layer and the second p-type SiGe layer to form a p-type SiGe optical matching layer; growing a third $SiO_2$ oxidation layer on the second $SiO_2$ oxidation layer; growing a heavily-doped negative n-type Si multiplication layer on the second SiGe layer and the first p-type SiGe layer; growing a first taper type Si waveguide layer and a second taper type Si waveguide layer on the third $SiO_2$ oxidation layer and the taper waveguide including the first SiGe layer and the second SiGe layer; growing anode electrodes on the GeOI substrate; and growing a cathode electrode on the heavily-doped n-type Si multiplication layer.

In a first possible implementation manner of the second aspect, a width range of the first SiGe layer is 1.4 µm to 30 µm, a length range of the first SiGe layer is 10 µm to 500 µm, and a thickness range of the first SiGe layer is 0.02 µm to 2.7 µm.

In a second possible implementation manner of the second aspect, a width range of the second SiGe layer progressively decreases from 1.4 µm to 30 µm to 1 µm to 20 µm, a length range of the second SiGe layer is 1 µm to 20 µm, and a thickness range of the second SiGe layer is 0.02 µm to 2.7 µm.

In a third possible implementation manner of the second aspect, a width range of the first p-type SiGe layer is 1 μm to 20 μm, a length range of the first p-type SiGe layer is 4 μm to 230 μm, and a thickness range of the first p-type SiGe layer is 0.02 μm to 2.7 μm.

In a fourth possible implementation manner of the second aspect, a width range of the second p-type SiGe layer is 1.1 μm to 22 μm, a length range of the second p-type SiGe layer is 4 μm to 230 μm, and a thickness range of the second p-type SiGe layer is 0.005 μm to 1 μm.

According to the avalanche photodiode and the manufacturing method thereof provided by the embodiments, a SiGe optical buffer layer of a proper thickness is added between a Si layer and a Ge layer, and a Ge composition in the SiGe layer is controlled to be less than or equal to 20%, which not only significantly alleviate a problem of a lattice mismatch between the Si layer and the Ge layer and greatly reduce a dark current of a SiGe avalanche photodiode, but also scarcely affect other performance such as quantum efficiency and a gain bandwidth product of the SiGe avalanche photodiode. In addition, an evanescent wave coupling structure is used, so as to avoid a problem of a declined component rate caused by a relatively thick SiGe buffer layer that is required when a common manner of coupling front normally incident light is used.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

The following abbreviations, acronyms, and initialisms apply:

APD: avalanche photodiode
Gb/s: gigabits per second
Ge: germanium
GeOI: germanium-on-insulator
I—Ge: intrinsic-germanium
PIN: positive-intrinsic-negative
PON: passive optical network
Si: silicon
SiGe: silicon-germanium
$SiO_2$: silicon dioxide
μm: micrometers
10G-PON: 10-gigabit passive optical network.

Embodiment 1

Figure 1:
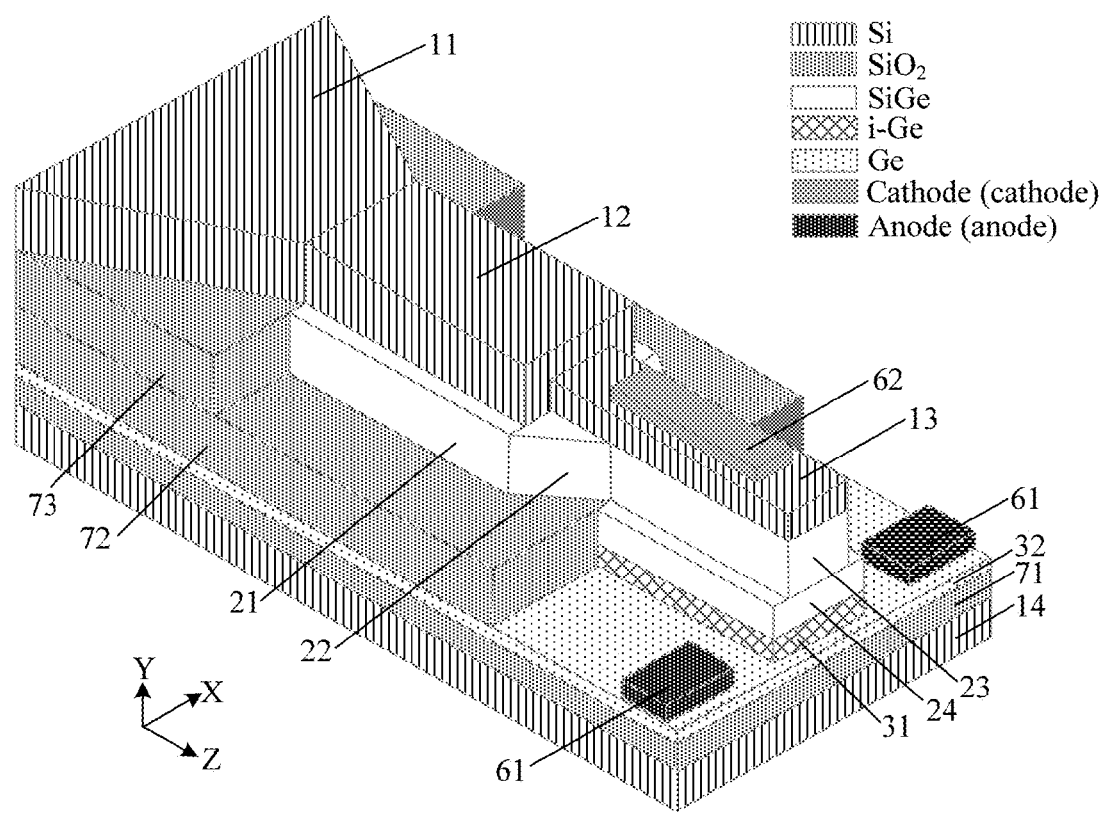
FIG. 1 is a schematic structural diagram of an avalanche photodiode according to an embodiment of the present disclosure.
Figure 2:
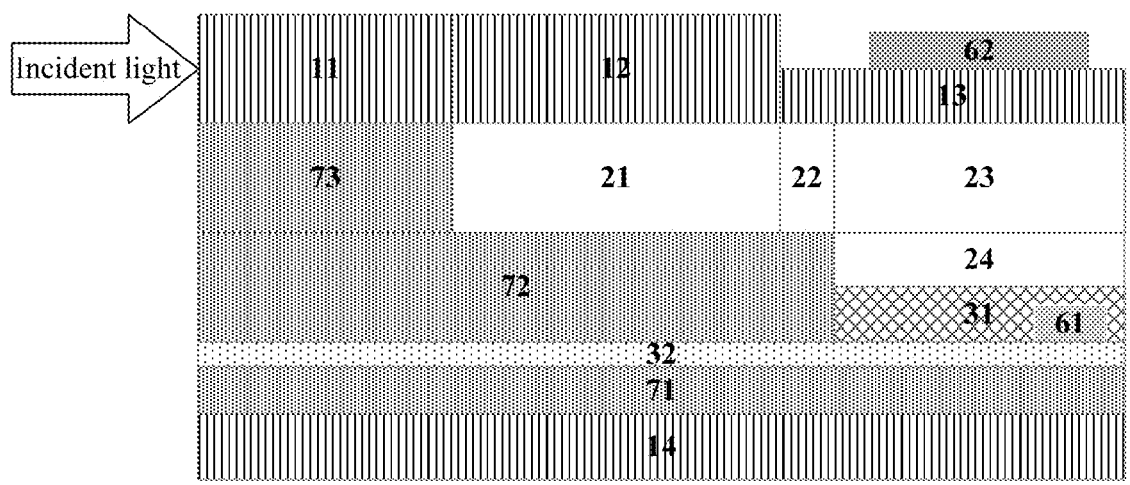
FIG. 2 is a schematic sectional diagram of an avalanche photodiode according to an embodiment of the present disclosure.

This embodiment of the present disclosure provides an avalanche photodiode. FIG. 1 is a schematic structural diagram of the avalanche photodiode, where a Z axis is a lightwave transmission direction, a Y axis is a height direction of the component, and an X axis is a width direction of the component. FIG. 2 is a schematic sectional diagram of the avalanche photodiode. Referring to FIG. 1 and FIG. 2, the avalanche photodiode includes a GeOI substrate, including an Si substrate layer 14, an $SiO_2$ oxidation layer 71, and a Ge layer 32, where an I—Ge absorption layer 31 is disposed on the GeOI substrate and is configured to absorb an optical signal and generate a photo-generated carrier; a second p-type SiGe layer 24 is disposed on the I—Ge absorption layer 31, and a first p-type SiGe layer 23 is disposed on the second p-type SiGe layer 24, where a Ge content in either the first p-type SiGe layer 23 or the second p-type SiGe layer 24 is less than or equal to 20%; a first $SiO_2$ oxidation layer 72 is further disposed on the GeOI substrate, and a second $SiO_2$ oxidation layer 73 is disposed on the first $SiO_2$ oxidation layer 72; a first SiGe layer 21 and a second SiGe layer 22 are disposed on the first $SiO_2$ oxidation layer 72, where a germanium Ge content in either of the SiGe layers is less than or equal to 20%; a first taper type Si waveguide layer 11 and a second taper type Si waveguide layer 12 are further respectively disposed on the second $SiO_2$ oxidation layer 73 and the first SiGe layer 21; a heavily-doped negative n-type silicon Si multiplication layer 13 is disposed on the second SiGe layer 22 and the first p-type SiGe layer 23; a cathode electrode 62 is disposed on the heavily-doped n-type silicon Si multiplication layer 13; and anode electrodes 61 are disposed on the GeOI substrate; where the first taper type silicon waveguide layer 11, the second taper type silicon waveguide layer 12, the first SiGe layer 21, and the second SiGe layer 22 form an evanescent wave coupling structure; the first SiGe layer 21, the second SiGe layer 22, the first p-type SiGe layer 23, and the second p-type SiGe layer 24 form a taper type structure; and the first SiGe layer 21, the second SiGe layer 22, the first p-type SiGe layer 23, the second p-type SiGe layer 24, and the I—Ge absorption layer 31 form an evanescent wave coupling structure.

Further, the first p-type SiGe layer 23 is used as a charge layer, an optical buffer layer, or an optical matching layer, and the second p-type SiGe layer 24 is used as an optical buffer layer or an optical matching layer.

The first p-type SiGe layer 23 and the second p-type SiGe layer 24 are configured to propagate optical signals at the first SiGe layer 21 and the second SiGe layer 22, and in addition, form an evanescent wave coupling structure together with the intrinsic-Ge absorption layer 31, to couple the optical signals to the intrinsic-Ge absorption layer 31, where the first SiGe layer 21 and the second SiGe layer 22 play roles of an optical matching layer and an optical buffer layer.

Further, the first taper type Si waveguide layer 11 and the second taper type Si waveguide layer 12 are configured to perform butt-coupling with an optical fiber, act as optical active areas to receive incident optical signals, and form an evanescent wave coupling structure together with the first SiGe layer 21 and the second SiGe layer 22, to couple the incident optical signals to the first SiGe layer 21 and the second SiGe layer 22.

The heavily-doped n-type Si multiplication layer 13 is used in an area in which a collision ionization effect and a multiplication effect are generated.

A total thickness of the first p-type SiGe 23 and the second p-type SiGe 24 and a total thickness of the first SiGe layer 21 and the second SiGe layer 22 are different and respectively match a thickness of the intrinsic-Ge absorption layer 31, and a thickness of the first taper type Si waveguide layer 11 or the second taper type Si waveguide layer 12, so as to optimize coupling efficiency and quantum efficiency.

Further, structural parameters of the APD according to this embodiment of the present disclosure are shown in Table 1:

TABLE 1

Structural parameters of an avalanche photodiode

| Name of a structural layer | Material | Width (μm) | Length (μm) | Thickness (μm) |
|---|---|---|---|---|
| First taper type Si waveguide layer 11 | Si | Decrease from 1.9-48 μm to 1.2-28 μm | 2-50 | 0.07-35 |
| Second Taper type Si waveguide layer 12 | Si | 1.2-28 | 10-500 | 0.07-35 |
| Heavily-doped n-type Si multiplication layer 13 | Si | 1-20 | 5-250 | 0.05-2.5 |
| First silicon-germanium (SiGe) layer 21 | SiGe alloy, where a Ge content is less than or equal to 20% | 1.4-30 | 10-500 | 0.02-2.7 |
| Second silicon-germanium (SiGe) layer 22 | SiGe alloy, where a Ge content is less than or equal to 20% | Decrease from 1.4-30 μm to 1-20 μm | 1-20 | 0.02-2.7 |
| First p-type silicon-germanium (SiGe) layer 23 | P-type SiGe alloy, where a Ge content is less than or equal to 20% | 1-20 | 4-230 | 0.02-2.7 |
| Second p-type silicon-germanium (SiGe) layer 24 | P-type SiGe alloy, where a Ge content is less than or equal to 20% | 1.1-22 | 4-230 | 0.005-1 |
| Intrinsic-germanium (I-Ge) absorption layer 31 | I-Ge | 1.1-22 | 4-230 | 0.04-4 |
| Layers 14, 71, and 32 on the Germanium-on-insulator (GeOI) substrate | Si for the layer 14, SiO$_2$ for the layer 71, and Ge for the layer 32 | \ | \ | \ |

According to this embodiment of the present disclosure, an SiGe optical buffer layer of a proper thickness is added between a Si layer and a Ge layer, and a Ge composition in the SiGe layer is controlled to be less than or equal to 20%, which not only significantly alleviate a problem of a lattice mismatch between the Si layer and the Ge layer and greatly reduce a dark current of an SiGe avalanche photodiode, but also scarcely affect other performance such as quantum efficiency and a gain bandwidth product of the SiGe avalanche photodiode. In addition, an evanescent wave coupling structure is used, so as to avoid a problem of a declined component rate caused by a relatively thick SiGe buffer layer that is required when a common manner of coupling front normally incident light is used.

Embodiment 2

Figure 3:
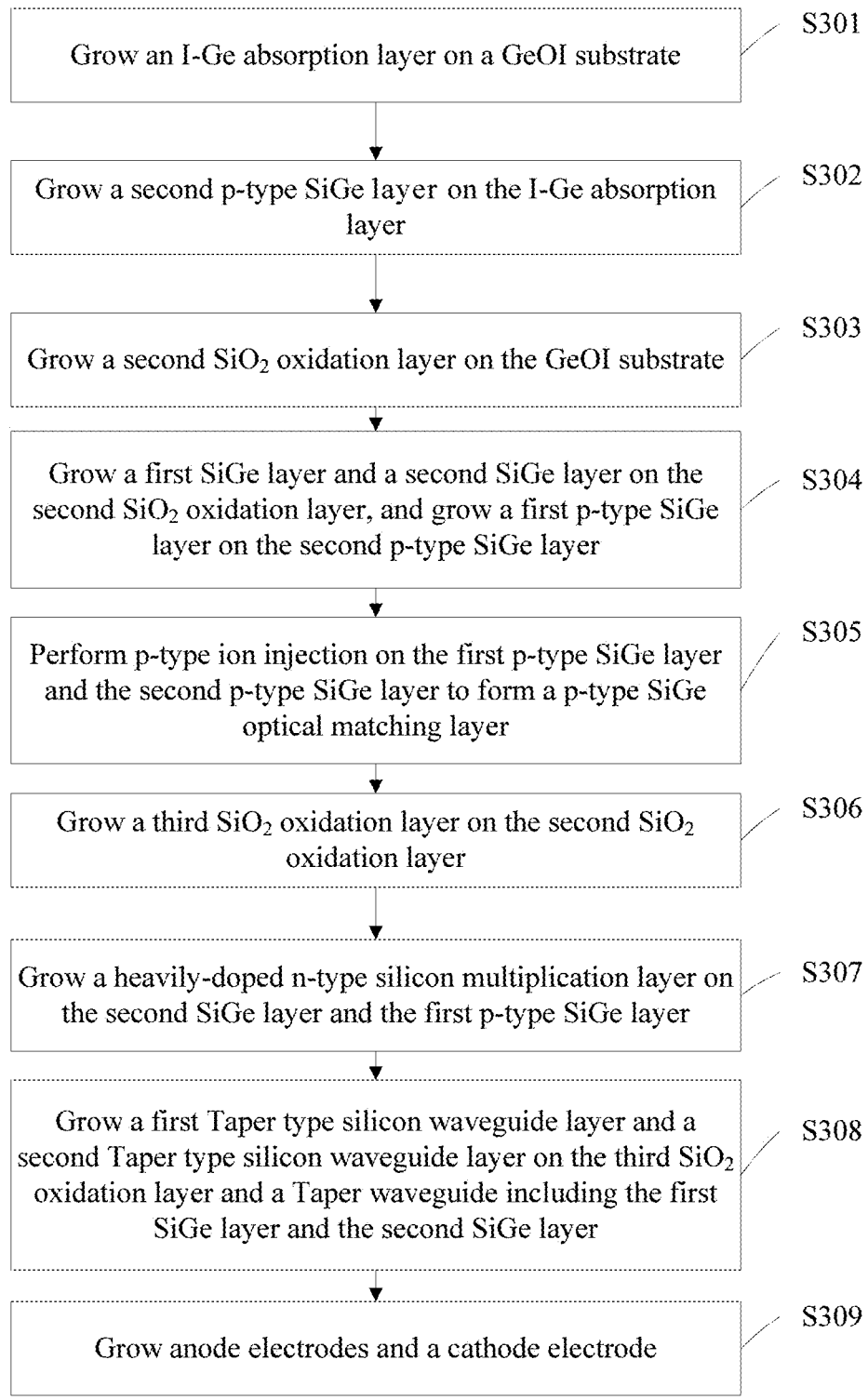
FIG. 3 is a flowchart of an avalanche photodiode manufacturing method according to an embodiment of the present disclosure.

Based on the embodiment corresponding to FIG. 1, another embodiment of the present disclosure provides an avalanche photodiode manufacturing method. FIG. 3 is a schematic flowchart of the avalanche photodiode manufacturing method, as shown in FIG. 3.

S301: Epitaxially grow an I—Ge absorption layer 31 on a GeOI substrate.

Optionally, the GeOI substrate includes a silicon Si substrate layer 14, a first SiO$_2$ oxidation layer 71, and a germanium Ge layer 32.

S302: Grow a second p-type SiGe layer 24 on the I—Ge absorption layer 31.

S303: Grow a second SiO$_2$ oxidation layer 72 on the GeOI substrate.

S304: Grow, on the second SiO$_2$ oxidation layer 72, a taper waveguide including a first SiGe layer 21 and a second SiGe layer 22, and grow a first p-type SiGe layer 23 on the second p-type SiGe layer 24.

S305: Perform p-type ion injection on the first p-type SiGe layer 23 and the second p-type SiGe layer 24 to form a p-type SiGe optical matching layer.

S306: Grow a third SiO$_2$ oxidation layer 73 on the second SiO$_2$ oxidation layer 72.

S307: Grow a heavily-doped n-type silicon Si multiplication layer 13 on the second SiGe layer 22 and the first p-type SiGe layer 23.

S308: Grow a first taper type Si waveguide layer 11 and a second taper type Si waveguide layer 12 on the third SiO$_2$ oxidation layer 73 and the taper waveguide including the first SiGe layer 21 and the second SiGe layer 22.

S309: Grow anode electrodes 61 on the GeOI substrate, and grow a cathode electrode 62 on the heavily-doped n-type Si multiplication layer 13.

Structural parameters of the avalanche photodiode are shown in Table 2:

TABLE 2

Structural parameters of an avalanche photodiode

| Name of a structural layer | Material | Width (μm) | Length (μm) | Thickness (μm) |
|---|---|---|---|---|
| First Taper type Si waveguide | Si | Decrease from | 2-50 | 0.07-35 |

TABLE 2-continued

Structural parameters of an avalanche photodiode

| Name of a structural layer | Material | Width (μm) | Length (μm) | Thickness (μm) |
|---|---|---|---|---|
| layer 11 | | 1.9-48 μm to 1.2-28 μm | | |
| Second Taper type Si waveguide layer 12 | Si | 1.2-28 | 10-500 | 0.07-35 |
| Heavily-doped n-type Si multiplication layer 13 | Si | 1-20 | 5-250 | 0.05-2.5 |
| First silicon-germanium (SiGe) layer 21 | SiGe alloy, where a Ge content is less than or equal to 20% | 1.4-30 | 10-500 | 0.02-2.7 |
| Second silicon-germanium (SiGe) layer 22 | SiGe alloy, where a Ge content is less than or equal to 20% | Decrease from 1.4-30 μm to 1-20 μm | 1-20 | 0.02-2.7 |
| First p-type silicon-germanium (SiGe) layer 23 | P-type SiGe alloy, where a Ge content is less than or equal to 20% | 1-20 | 4-230 | 0.02-2.7 |
| Second p-type silicon-germanium (SiGe) layer 24 | P-type SiGe alloy, where a Ge content is less than or equal to 20% | 1.1-22 | 4-230 | 0.005-1 |
| Intrinsic-germanium (I-Ge) absorption layer 31 | I-Ge | 1.1-22 | 4-230 | 0.04-4 |
| Layers 14, 71, and 32 on the Germanium-on-insulator (GeOI) substrate | Si for the layer 14, SiO₂ for the layer 72, and Ge for the layer 32 | \ | \ | \ |

According to the avalanche photodiode manufacturing method provided by this embodiment, a SiGe optical buffer layer/optical matching layer of a proper thickness is added between a Si layer and a Ge layer, and a Ge composition in the SiGe layer is controlled to be less than or equal to 20%, which not only significantly alleviate a problem of a lattice mismatch between the Si layer and the Ge layer and greatly reduce a dark current of a SiGe avalanche photodiode, but also scarcely affect other performance such as quantum efficiency and a gain bandwidth product of the SiGe avalanche photodiode. In addition, an evanescent wave coupling structure is used, so as to avoid a problem of a declined component rate caused by a relatively thick SiGe buffer layer that is required when a common manner of coupling front normally incident light is used.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An avalanche photodiode (APD) comprising:
   a germanium-on-insulator (GeOI) substrate;
   an intrinsic-germanium (I—Ge) absorption layer disposed on the GeOI substrate and configured to:
      absorb an optical signal; and
      generate a photo-generated carrier;
   a second p-type silicon-germanium (SiGe) layer disposed on the I—Ge absorption layer;
   a first p-type SiGe layer disposed on the second p-type SiGe layer, wherein a germanium (Ge) content in either the first p-type SiGe layer or the second p-type SiGe layer is less than or equal to 20%;
   a first silicon dioxide (SiO₂) oxidation layer disposed on the GeOI substrate;
   a second SiO₂ oxidation layer disposed on the first SiO₂ oxidation layer;
   a first SiGe layer disposed on the first SiO₂ oxidation layer (72);
   a second SiGe layer disposed on the first SiO₂ oxidation layer, wherein a Ge content in either the first SiGe layer or the second SiGe layer is less than or equal to 20%;
   a first taper type silicon (Si) waveguide layer disposed on the second SiO₂ oxidation layer;
   a second taper type Si waveguide layer disposed on the first SiGe layer;
   a heavily-doped n-type Si multiplication layer disposed on the second SiGe layer and the first p-type SiGe layer;
   a cathode electrode is disposed on the heavily-doped n-type Si multiplication layer; and
   anode electrodes are disposed on the GeOI substrate,
   wherein the first taper type Si waveguide layer, the second taper type Si waveguide layer, the first SiGe layer, and the second SiGe layer form an evanescent wave coupling structure,
   wherein the first SiGe layer, the second SiGe layer, the first p-type SiGe layer, and the second p-type SiGe layer form a taper type structure, and
   wherein the first SiGe layer, the second SiGe layer, the first p-type SiGe layer, the second p-type SiGe layer, and the I—Ge absorption layer form an evanescent wave coupling structure.

2. The APD of claim 1, wherein a first sum of a first thickness of the first SiGe layer and a second thickness of the second SiGe layer is different from a second sum of a third thickness of the first p-type SiGe layer and a fourth thickness of the second p-type SiGe layer.

3. The APD of claim 1, wherein a width range of the first SiGe layer is 1.4 micrometers (μm) to 30 μm.

4. The APD of claim 3, wherein a length range of the first SiGe layer is 10 μm to 500 μm.

5. The APD of claim 4, wherein a thickness range of the first SiGe layer is 0.02 μm to 2.7 μm.

6. The APD of claim 1, wherein a width range of the second SiGe layer progressively decreases from 1.4 micrometers (μm) to 30 μm to 1 μm to 20 μm.

7. The APD of claim 6, wherein a length range of the second SiGe layer is 1 μm to 20 μm.

8. The APD of claim 7, wherein a thickness range of the second SiGe layer is 0.02 μm to 2.7 μm.

9. The APD of claim 1, wherein a width range of the first p-type SiGe layer is 1 micrometer (μm) to 20 μm.

10. The APD of claim 9, wherein a length range of the first p-type SiGe layer is 4 μm to 230 μm.

11. The APD of claim 10, wherein a thickness range of the first p-type SiGe layer is 0.02 μm to 2.7 μm.

12. The APD of claim 1, wherein a width range of the second p-type SiGe layer is 1.1 micrometers (μm) to 22 μm.

13. The APD of claim 12, wherein a length range of the second p-type SiGe layer is 4 μm to 230 μm.

14. The APD of claim 13, wherein a thickness range of the second p-type SiGe layer is 0.005 μm to 1 μm.

15. An avalanche photodiode (APD) manufacturing method comprising:
epitaxially growing an intrinsic-germanium (I—Ge) absorption layer on a germanium-on-insulator (GeOI) substrate;
growing a second p-type silicon-germanium (SiGe) layer on the I—Ge absorption layer;
growing a second silicon dioxide ($SiO_2$) oxidation layer on the GeOI substrate;
growing, on the second $SiO_2$ oxidation layer, a taper waveguide comprising a first SiGe layer and a second SiGe layer;
growing a first p-type SiGe layer on the second p-type SiGe layer;
performing p-type ion injection on the first p-type SiGe layer and the second p-type SiGe layer to form a p-type SiGe optical matching layer;
growing a third $SiO_2$ oxidation layer on the second $SiO_2$ oxidation layer;
growing a heavily-doped n-type Si multiplication layer on the second SiGe layer and the first p-type SiGe layer;
growing a first taper type Si waveguide layer and a second taper type Si waveguide layer on the third $SiO_2$ oxidation layer and the taper waveguide;
growing anode electrodes on the GeOI substrate; and
growing a cathode electrode on the heavily-doped n-type Si multiplication layer.

16. The method of claim 15, wherein a width range of the first SiGe layer is 1.4 micrometers (μm) to 30 μm, and wherein a length range of the first SiGe layer is 10 μm to 500 μm.

17. The method of claim 16, wherein a thickness range of the first SiGe layer is 0.02 μm to 2.7 μm.

18. The method of claim 15, wherein a width range of the second SiGe layer progressively decreases from 1.4 micrometers (μm) to 30 μm to 1 μm to 20 μm, a length range of the second SiGe layer is 1 μm to 20 μm, and a thickness range of the second SiGe layer is 0.02 μm to 2.7 μm.

19. The method of claim 15, wherein a width range of the first p-type SiGe layer is 1 micrometer (μm) to 20 μm, a length range of the first p-type SiGe layer is 4 μm to 230 μm, and a thickness range of the first p-type SiGe layer is 0.02 μm to 2.7 μm.

20. The method of claim 15, wherein a width range of the second p-type SiGe layer is 1.1 micrometers (μm) to 22 μm, a length range of the second p-type SiGe layer is 4 μm to 230 μm, and a thickness range of the second p-type SiGe layer is 0.005 μm to 1 μm.

* * * * *